(12) United States Patent  
Singh et al.

(10) Patent No.: US 9,148,946 B1  
(45) Date of Patent: Sep. 29, 2015

(54) ELECTRONIC ASSEMBLY FOR AN INVERTER

(71) Applicant: DEERE & COMPANY, Moline, IL (US)

(72) Inventors: Brij N Singh, West Fargo, ND (US); John N Oenick, Bettendorf, IA (US); Aron Fisk, Fargo, ND (US)

(73) Assignee: DEERE & COMPANY, Moline, IL (US)

( * ) Notice: Subject to any disclaimer, the term of this patent is extended or adjusted under 35 U.S.C. 154(b) by 0 days.

(21) Appl. No.: 14/291,872

(22) Filed: May 30, 2014

Related U.S. Application Data

(60) Provisional application No. 61/971,590, filed on Mar. 28, 2014.

(51) Int. Cl.
| | |
|---|---|
| *H01L 23/10* | (2006.01) |
| *H01L 23/34* | (2006.01) |
| *H05K 1/02* | (2006.01) |
| *H05K 7/20* | (2006.01) |

(52) U.S. Cl.  
CPC .............. *H05K 1/021* (2013.01); *H05K 1/0272* (2013.01); *H05K 7/20* (2013.01)

(58) Field of Classification Search  
CPC ........ H01L 23/34; H01L 23/36; H01L 23/473; H01L 25/072  
USPC ................... 257/706, 713, 714, 723, E23.051  
See application file for complete search history.

(56) References Cited

U.S. PATENT DOCUMENTS

| | | | |
|---|---|---|---|
| 8,810,026 B2* | 8/2014 | Kadoguchi et al. ............ | 257/712 |
| 2010/0133684 A1* | 6/2010 | Oka et al. ........................ | 257/712 |
| 2011/0037166 A1* | 2/2011 | Ikeda et al. .................... | 257/712 |
| 2012/0181679 A1* | 7/2012 | Kadoguchi et al. ............ | 257/676 |
| 2013/0201741 A1* | 8/2013 | Tompkins et al. ............. | 363/131 |
| 2013/0235636 A1* | 9/2013 | Kadoguchi et al. ........... | 363/131 |
| 2014/0098588 A1* | 4/2014 | Kaneko et al. ................ | 363/141 |
| 2015/0003019 A1* | 1/2015 | Ide et al. ........................ | 361/705 |

\* cited by examiner

*Primary Examiner* — Nitin Parekh

(57) ABSTRACT

An electronic assembly for an inverter comprises a substrate having a dielectric layer and metallic circuit traces. A plurality of terminals are arranged for connection to a direct current source. A first semiconductor and a second semiconductor are coupled together between the terminals of the direct current source. A primary metallic island (e.g., strip) is located in a primary zone between the first semiconductor and the second semiconductor. The primary metallic island has a greater height or thickness than the metallic circuit traces. The primary metallic island provides a heat sink to radiate heat.

22 Claims, 10 Drawing Sheets

ELECTRONIC ASSEMBLY FOR AN INVERTER

RELATED APPLICATION

This document (including the drawings) claims priority and the benefit of the filing date based on U.S. provisional application No. 61/971,590, filed Mar. 28, 2014 under 35 U.S.C. §119 (e), where the provisional application is hereby incorporated by reference herein.

FIELD OF THE INVENTION

This disclosure relates to an electronic assembly for an inverter.

BACKGROUND

In certain prior art, an electronic assembly may have inadequate heat dissipation that reduces the longevity or maximum power output of power semiconductor switches.

Accordingly, there is need for an electronic assembly for an inverter with improved heat dissipation.

SUMMARY

In one embodiment, an electronic assembly for an inverter comprises a substrate having a dielectric layer and metallic circuit traces. A plurality of terminals is arranged for connection to a direct current source. A first semiconductor and a second semiconductor are coupled together between the terminals of the direct current source. A primary metallic island (e.g., strip) is located in a primary zone between the first semiconductor and the second semiconductor. The primary metallic island has a greater height or thickness than the metallic circuit traces. The primary metallic island provides a heat sink to radiate heat.

BRIEF DESCRIPTION OF THE DRAWINGS

Like reference numbers in different drawings indicate like elements.

DETAILED DESCRIPTION

Figure 1:
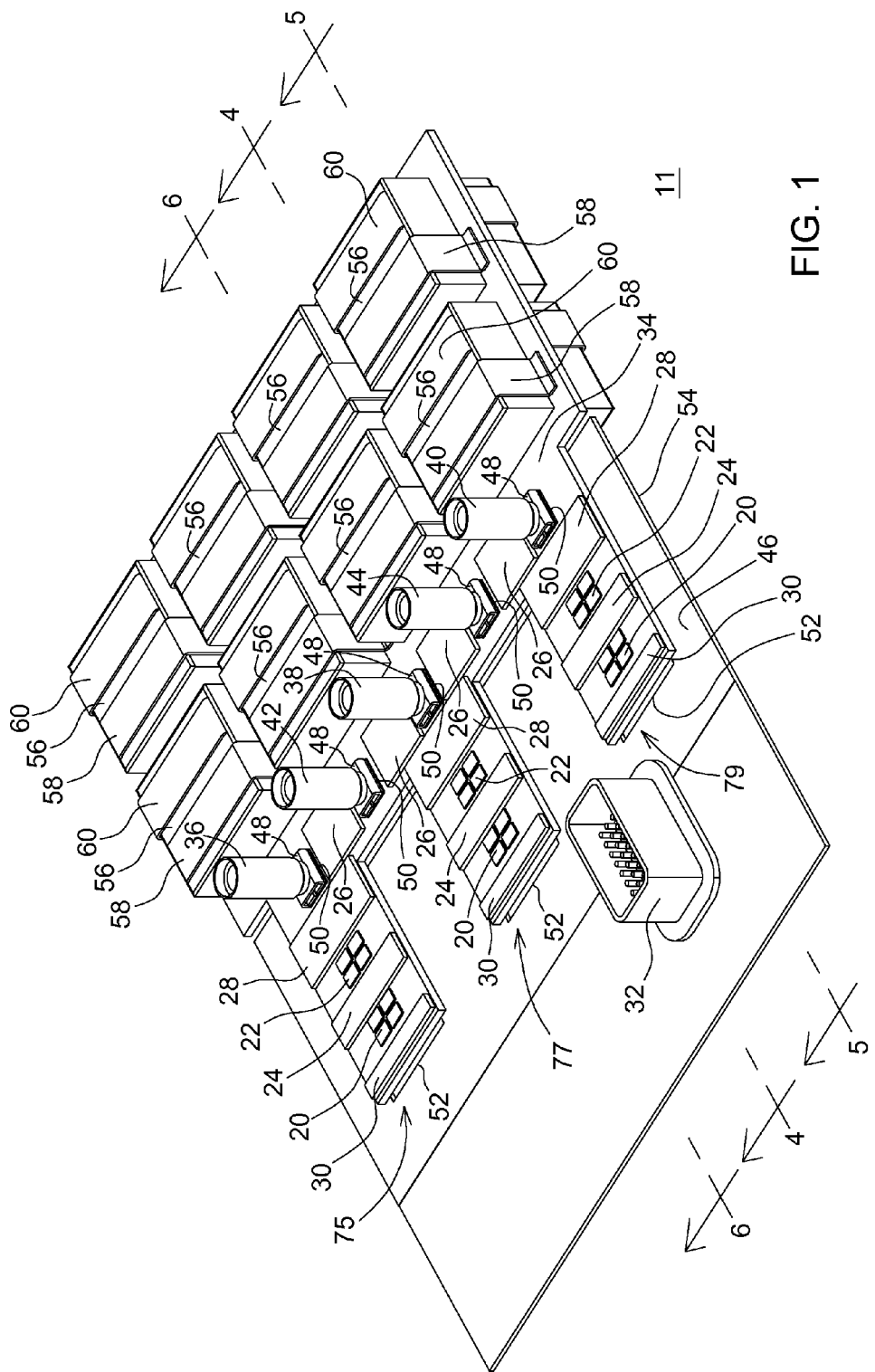
FIG. 1 is a perspective view of one embodiment of the electronic assembly for an inverter.

In one embodiment, FIG. 1 shows a circuit board assembly 11 of an electronic assembly 200 for an inverter. The circuit board assembly 11, of the electronic assembly 200, comprises a substrate 34 having a dielectric layer 54 and one or more metallic circuit traces on one or both sides of the substrate 34. Direct current terminals are arranged for connection to a direct current source. A first semiconductor 20 and a second semiconductor 22 are coupled together between the terminals of the direct current source. A primary metallic island 24 (e.g., strip) is located in a primary zone between the first semiconductor 20 and the second semiconductor 22. The primary metallic island 24 has a greater height or thickness than the metallic circuit traces. The primary metallic island 24 provides a heat sink to radiate heat.

In one embodiment, the direct current terminals (42, 44) comprise surface mount connectors, such as a female surface mount connector that is generally cylindrical and that comprises a metal or an alloy material. Each connector (36, 38, 40, 42, 44) may comprise a surface mount connector. Each connector (36, 38, 40, 42, 44) may have a mounting pad 48 at one end for mounting to a corresponding conductive pad 50 on the substrate 34, where the conductive pad 50 is associated with or electrically connected to one or more conductive traces (e.g., 406).

As illustrated, the electronic assembly 200 shows three phases or three switching sections, where each phase has a first semiconductor 20 coupled to a second semiconductor 22. At the inputs of each switching section, the first direct current terminal 42 and the second direct current terminal 44 provide direct current to each phase or switching section. The output of each switching section is defined by set of alternating current connectors.

For each phase, the first semiconductor 20 may comprise a semiconductor switch (e.g., low-side semiconductor switch) that with at least one of its switching terminals coupled to one side (e.g., low side or negative terminal) of the direct current bus or direct current source that feeds the direct current terminals. For example, the switching terminals may refer to the emitter and collector if the first semiconductor 20 comprises a transistor, or the switching terminals may refer to the source and drain if the first semiconductor 20 comprises a field effect transistor. A control terminal (e.g., base or gate) of the first switching transistor is coupled to a control circuit or a driver that is not shown.

For each phase, the second semiconductor 22 may comprise a semiconductor switch (e.g., high-side semiconductor switch) that with at least one of its switching terminals coupled to one side (e.g., high side or positive terminal) of the direct current bus or direct current source that feeds the direct current terminals. For example, the switching terminals may refer to the emitter and collector if the first semiconductor 20 comprises a transistor, or the switching terminals may refer to the source and drain if the first semiconductor 20 comprises a field effect transistor. A control terminal (e.g., base or gate) of the first switching transistor is coupled to a control circuit or a driver that is not shown.

The output of each switching section is defined by set of alternating current (AC) connectors (36, 38, 40). As illustrated in FIG. 1, the alternating current connectors comprise a first AC connector 36, a second AC connector 38 and a third AC connector 40 for the first phase switching section, the second phase switching section and third phase switching section, respectively. In one embodiment, the AC connectors (36, 38, 40) comprise surface mount connectors, such as a female surface mount connector that is generally cylindrical and that comprises a metal or an alloy material. Each surface mount connector (36, 38, 40) may have a mounting pad 48 at one end for mounting to a corresponding conductive pad 50 on the substrate 34, where the conductive pad 50 is associated with or electrically connected to one or more conductive traces (e.g., 406).

For each phase, primary metallic island 24 (e.g., strip) is located in a primary zone between the first semiconductor 20 and the second semiconductor 22. In one configuration, each primary metallic island 24 generally has a greater height or thickness than the metallic circuit traces. For example, the primary metallic island 24 provides a heat sink to radiate or conduct heat to an interior of the first enclosure portion 100 or the first housing assembly 132. The first enclosure portion 100 may communicate the radiated or conducted heat toward a conduit or transition for circulating or conveying coolant through the first enclosure portion 100. In one embodiment, the primary metallic island 24 comprises a copper pour.

A secondary metallic island 26 (e.g., strip) is located in a secondary zone between adjacent surface mount connectors or between any DC terminal (42, 44) and any adjacent AC connector (36, 38, 40). For example, the secondary metallic island 26 provides a heat sink to radiate/conduct heat to an interior of the first enclosure portion 100 or the first housing assembly 132. The first enclosure portion 100 may communicate the radiated or conducted heat towards a conduit or transition for circulating or conveying coolant through the first enclosure portion 100. In one embodiment, the secondary metallic island 26 comprises a copper pour.

A tertiary metallic island 28 is located on the substrate 34 between a second semiconductor switch 22 and a corresponding AC connector, or more generally between a second semiconductor switch 22 and surface mount connector. In one configuration, each tertiary metallic island 28 generally has a greater height or thickness than the metallic circuit traces. For example, the tertiary metallic island 28 provides a heat sink to radiate or conduct heat to an interior of the first enclosure portion 100 or the first housing assembly 132. The first enclosure portion 100 may communicate the radiated or conducted heat toward a conduit or transition for circulating or conveying coolant through the first enclosure portion 100. In one embodiment, the tertiary metallic island 28 comprises a copper pour.

A quaternary metallic island 30 is located on the substrate 34 proximate to a first semiconductor 20 switch (e.g., for each phase). In one configuration, each quaternary metallic island 30 generally has a greater height or thickness than the metallic circuit traces. For example, the quaternary metallic island 30 provides a heat sink to radiate or conduct heat to an interior of the first enclosure portion 100 or the first housing assembly 132. The first enclosure portion 100 may communicate the radiated or conducted heat toward a conduit or transition for circulating or conveying coolant through the first enclosure portion 100. In one embodiment, the quaternary metallic island 30 comprises a copper pour.

In one embodiment, the first semiconductor switch 20 and the second semiconductor switch 22 comprise metal-oxide semiconductor field-effect transistors (MOSFET's), or insulated gate bi-polar transistors (IGBT's) composed of silicon, silicon carbide, gallium nitride, or other semiconductor material that is packaged in the form of planar chipsets. These chipsets could be realized in planar shape, packaged and ready for pick-and-placement manufacturing processes on substrate. The thermal management is enhanced by a housing (with integral coolant channels within the first enclosure portion 100 in FIG. 4) and the second enclosure portion 102) offers the opportunity to raise current density (A/cm2) of the substantially planar first semiconductor switch 20 and the second semiconductor switch 22 (e.g., MOSFET/IGBT chipsets). Therefore, at a given current rating of electronics assembly 200 it is possible to use a die of smaller size than otherwise possible for the semiconductor material used in the first semiconductor switch 20 and the second semiconductor switch 22, depending of type of switching devices used in inverter design.

The reduction of the die size of the semiconductor or package size of the first semiconductor switch 20 and the second semiconductor switch 22 is supported by double-sided thermal management of the substantially planar chipsets coupled with lateral withdrawal of heat flux through power interconnects. Accordingly, the first semiconductor switch 20 and the second semiconductor switch 22 are placed in a thermally managed environment that allows each semiconductor die to operate at lower junction temperature (Tj). Here, the thermally managed environment may be referred to as multi-sided thermal management of power switching devices (20, 22). A lower value of Tj at a given power offers opportunity to decrease the die size and package size the first semiconductor switch 20 and the second semiconductor switch 22 without compromising or decreasing inverter capability. Decreasing the size of the die of Si, SiC and GaN material in the semiconductor switches (20, 22) could proportionally increase the area of the conductive traces, islands, heat sink areas, or bus bar around each chipset making it more effective for lateral flow of heat flux from die to the coolant channel in within the first enclosure portion 100 (FIG. 4) and the second enclosure portion 102.

In one configuration, a group of capacitors 56 may be mounted on or to the substrate 34. For example, as shown in FIG. 1, a first array of capacitors 56 is mounted on a first side of the substrate 34, whereas a second array of capacitors 56 is mounted on a second side of substrate 34 opposite the first side. Although two rows of four capacitors 56 are shown on each side of the substrate 34, any suitable number of capacitors 56 may be used. As shown, each capacitor 56 has a first terminal 58 and a second terminal 60. In one configuration, each capacitor 56 may comprise an electrolytic capacitor 56.

In one embodiment, the capacitors comprise surface-mount, low-profile film capacitors. The package of the capacitors 56 with high-surface area conductive terminals (58, 60) and thermal interface material around the capacitors 56 facilitates conductive thermal management for lower temperature rise per ampere current filtered and higher ampere per unit capacitance (e.g., micro-Farad (uF)) required or used. The thermal interface material comprises a cured (e.g., substantially cross-linked) polymer, elastomer or plastic or solid dielectric material that is positioned, inserted, injected as a resin in an uncured state, in liquid phase, or in a semi-solid phase between the interior of the first enclosure and the second enclosure and the capacitors 56 for enhanced heat dissipation. The capacitors 56 can be configured as parts that can withstand lead-free reflow temperature profile needed for surface mount manufacturing line, for example.

As illustrated in FIG. 1, an ancillary substrate 46 is mounted in a different plane that is generally parallel to or offset from the plane of the substrate 34. A connector has a dielectric portion and terminals, where the connector is mounted on or through the ancillary substrate 46. The ancillary circuit board may have one or more openings 52. For example, the ancillary circuit board may have ancillary openings 52 for each phase or switching section, such that a second enclosure portion 102 or a second housing assembly 134 may contact or be in close proximity to the switching section to conduct heat away from the switching section.

Figure 9:
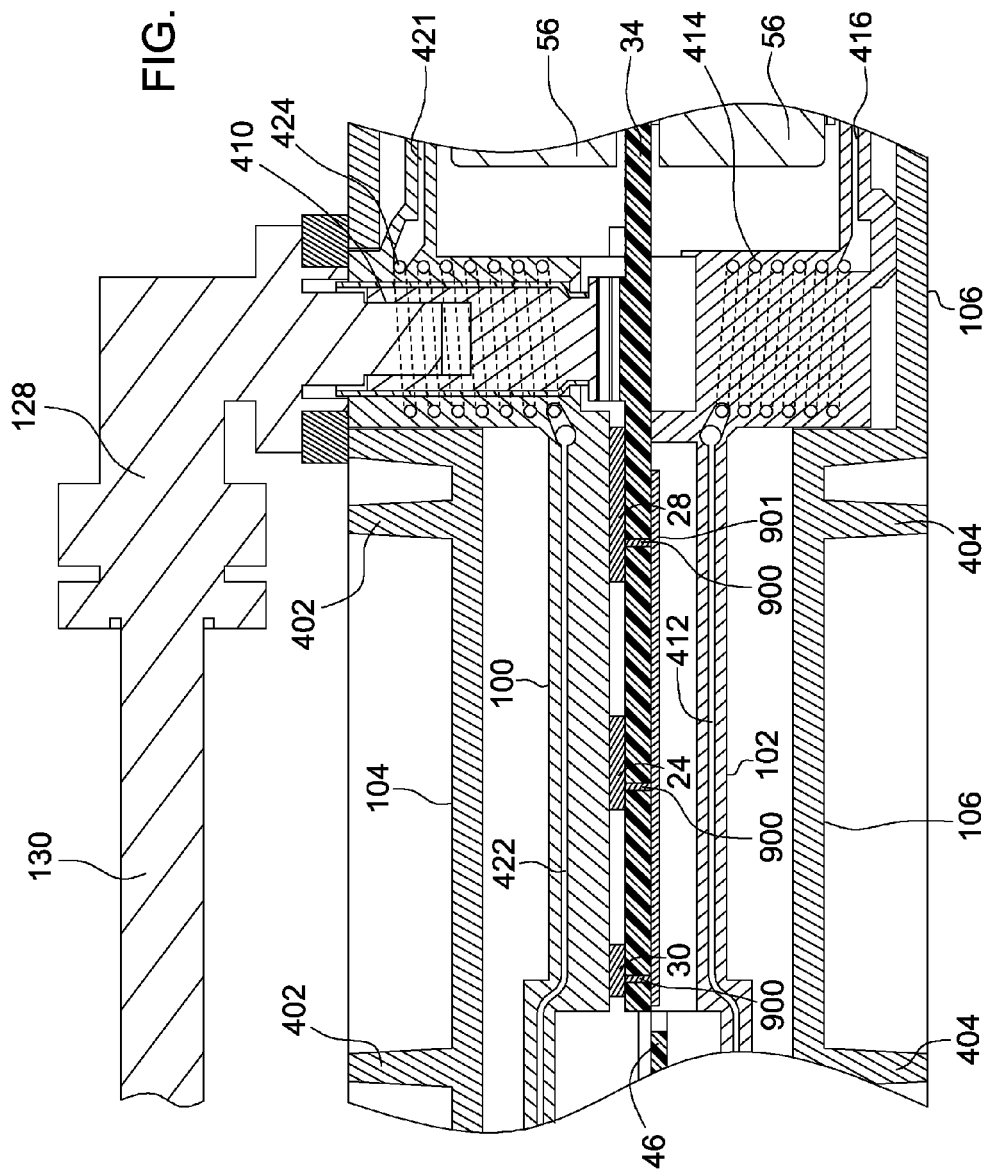
FIG. 9 is a cross section of yet another embodiment that is analogous to the small enlarged portion of rectangular region 7 of FIG. 5, where a conductive via and a ground plane is present.

In an alternate embodiment, the heat is conducted away from one or more metallic islands (e.g., 24, 28, 30) through one or more thermally conductive vias 900 (e.g., thermally conductive through-holes, thermally conductive blind vias, or thermally and electrically conductive vias, or other structures) connected between the one or more metallic islands (e.g., 24, 28, 30) and a heat-sink island 901 or heat sink on an opposite side of the substrate 34, as best illustrated in FIG. 9. In one embodiment, the heat sink or heat-sink island 901 is isolated on a phase-by-phase basis, such that each phase heat-sink island (e.g., first phase heat sink island) is mechanically separate and electrically isolated (e.g., electromagnetically isolated over an operational frequency range) from respective other phase heat sink islands (e.g., on an underside or the opposite side of the substrate 34) of the other phase outputs (e.g., second phase heat-sink island and third phase heat-sink island) of the electronic assembly 200. Further, cumulative with or separate from the heat transfer through the thermally conductive vias 900, the heat is transferred to the fluid or coolant in the coolant channel (e.g., within the first enclosure portion 100 or second enclosure portion).

The circuit board assembly 11 of electronic assembly 200 may comprise a plurality of first surface mount connectors mounted on the substrate 34 that are electrically connected to the terminals and a secondary metallic island 26 located in a secondary zone between adjacent surface mount connectors.

Figure 2:
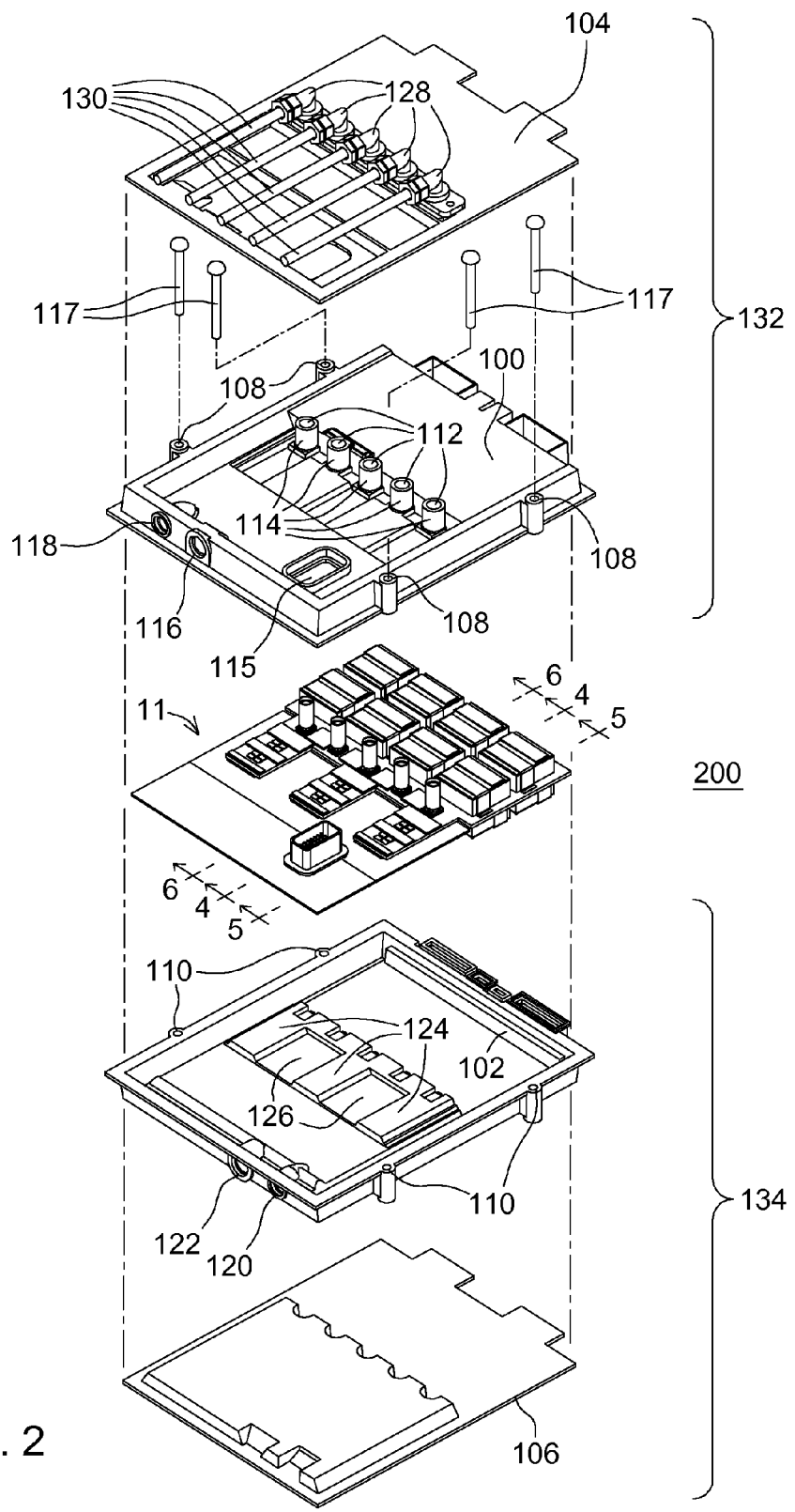
FIG. 2 is a perspective, exploded view of the electronic assembly of FIG. 1 that further illustrates an upper housing assembly and a lower housing assembly.

FIG. 2 illustrates a housing assembly that encloses the circuit board assembly 11 of FIG. 1. In one embodiment, the housing comprises a first housing assembly 132 and a second housing assembly 134, where the first housing assembly 132 mates with the second housing assembly 134. The first housing assembly 132 comprises a first enclosure portion 100 and a third enclosure portion 104. The second housing assembly 134 comprises a second enclosure portion 102 and a fourth enclosure portion 106.

As shown, the first enclosure portion 100 and the second enclosure portion 102 have mounting holes (108, 110) for receiving one or more fasteners 117 to fasten or joint the first enclosure portion 100 to the second enclosure portion 102, where the circuit board assembly 11 of FIG. 1 is sandwiched between the first and second enclosure portions 102 or enclosed by the first and second enclosure portions 102. The third enclosure portion 104 is secured to or attached to the first enclosure portion 100. For example, the third enclosure portion 104 may comprise a heat sink or upper cover of the housing assembly. Similarly, the fourth enclosure portion 106 may comprise a heat sink or a lower cover of the housing assembly. The fourth enclosure portion 106 is secured to or attached to the second enclosure portion 102. In one embodiment, the first enclosure portion 100 and the second enclosure portion 102 are composed of a polymer, a plastic, a polymer matrix with a filler, such as reinforced fiber or carbon fiber. For instance, the first enclosure portion 100 and the second enclosure portion 102 may be manufactured by a three-dimensional printer capable of printing a three-dimensional structure with various openings 52, conduits or passageways for conducting fluid to cool the circuit board assembly 11 or its heat generating components. In an illustrative configuration, the third enclosure portion 104 and the fourth enclosure portion 106 may be constructed of a metal material, a metallic material, an alloy material or heat sink material, such as aluminum, cast aluminum. The third enclosure portion 104 and the fourth enclosure portion 106 may be constructed with a three-dimensional printer capable of printing a three-dimensional structure from a polymer, plastic or resin that contains electrically conductive particles, such as metallic particles to promote heat dissipation, or any suitable thermally conductive polymeric materials.

A first interior surface of the first enclosure portion 100 may conform substantially in size and shape to mate or interlock with the one side of the circuit board assembly 11, whereas a second interior surface of second enclosure portion 102 may conform substantially in size and shape to mate or interlock with an opposite side. For example, the first enclosure portion 100 has generally cylindrical recesses that engage with corresponding AC connectors and DC terminals on the substrate 34. Further, the first enclosure portion 100 has a first switching section 75 recess that is generally rectangular, polyhedron-like, or that otherwise conforms to the shape and size of the first switching section 75 above the substrate 34; a second switching section 77 recess 126 that is generally rectangular, polyhedron-like, or that otherwise conforms to the shape and size of the second switching section 77 above the substrate 34; a third switching section 79 recess that is generally rectangular, polyhedron-like, or that otherwise conforms to the shape and size of the third switching section 79 above the substrate 34. With respect the capacitor 56 arrays, the first enclosure has an aggregate capacitor recess or individual capacitor recesses that conform to the size and shape of corresponding capacitors 56 on the circuit board assembly 11.

Figure 8:
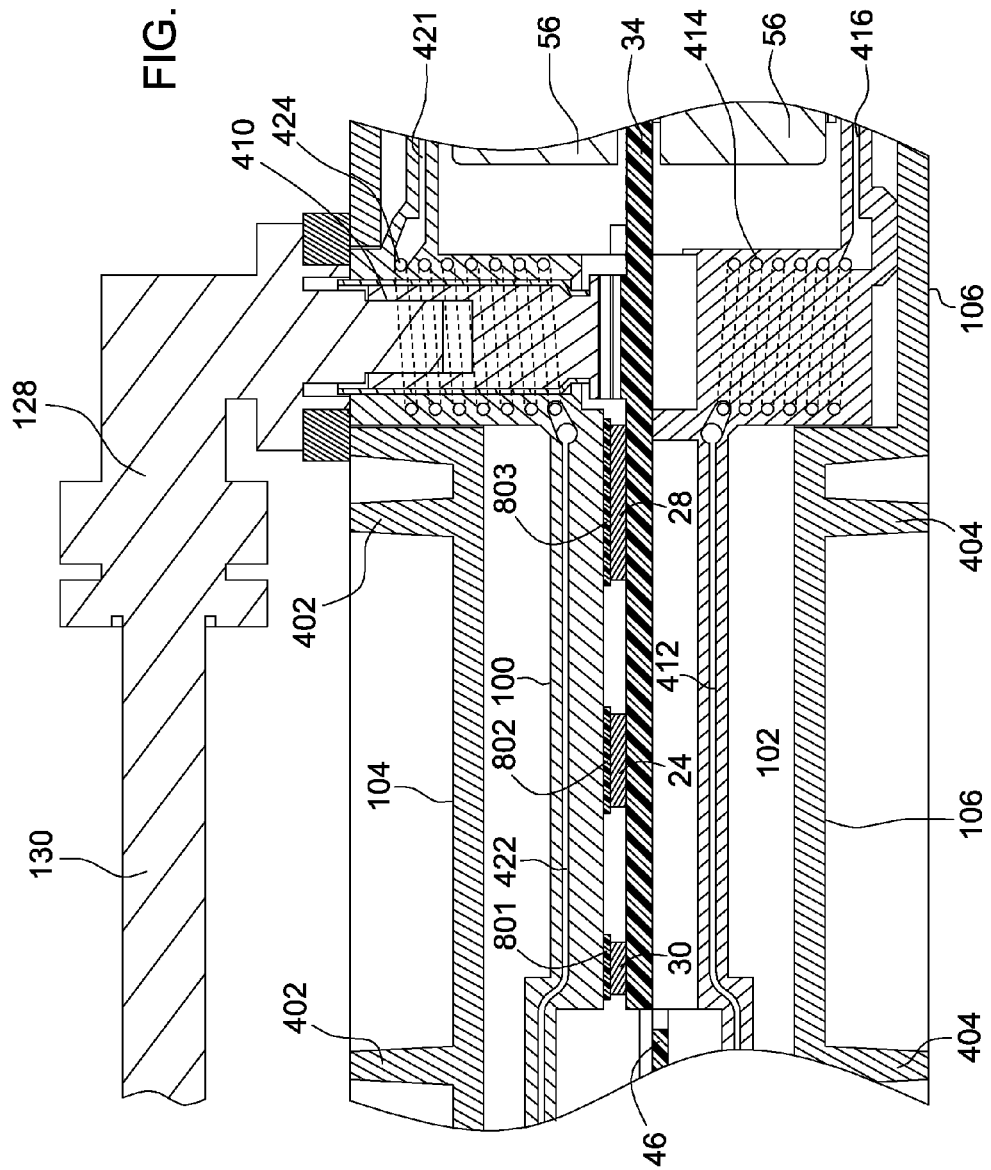
FIG. 8 is a cross section of another embodiment that is analogous to the small enlarged portion of rectangular region 7 of FIG. 4, where a thermal interface material is present.

The second enclosure portion 102 has raised protrusions 124 that for each switching section, where the raised protrusions 124 can contact the underside of each switching section. In an alternate embodiment, the second enclosure portion 102 has raised protrusions that for each switching section, where the raised protrusions can contact the underside of each switching section with a thermally conductive interface material, as illustrated in FIG. 8. The thermally conductive interface material comprises an intervening thermally conductive adhesive, an intervening thermally conductive grease, or an intervening thermally conductive polymer. As shown, the second enclosure portion 102 has an aggregate capacitor 56 recess that conforms to the size and shape of corresponding capacitors 56 on the circuit board assembly 11.

Figure 10:
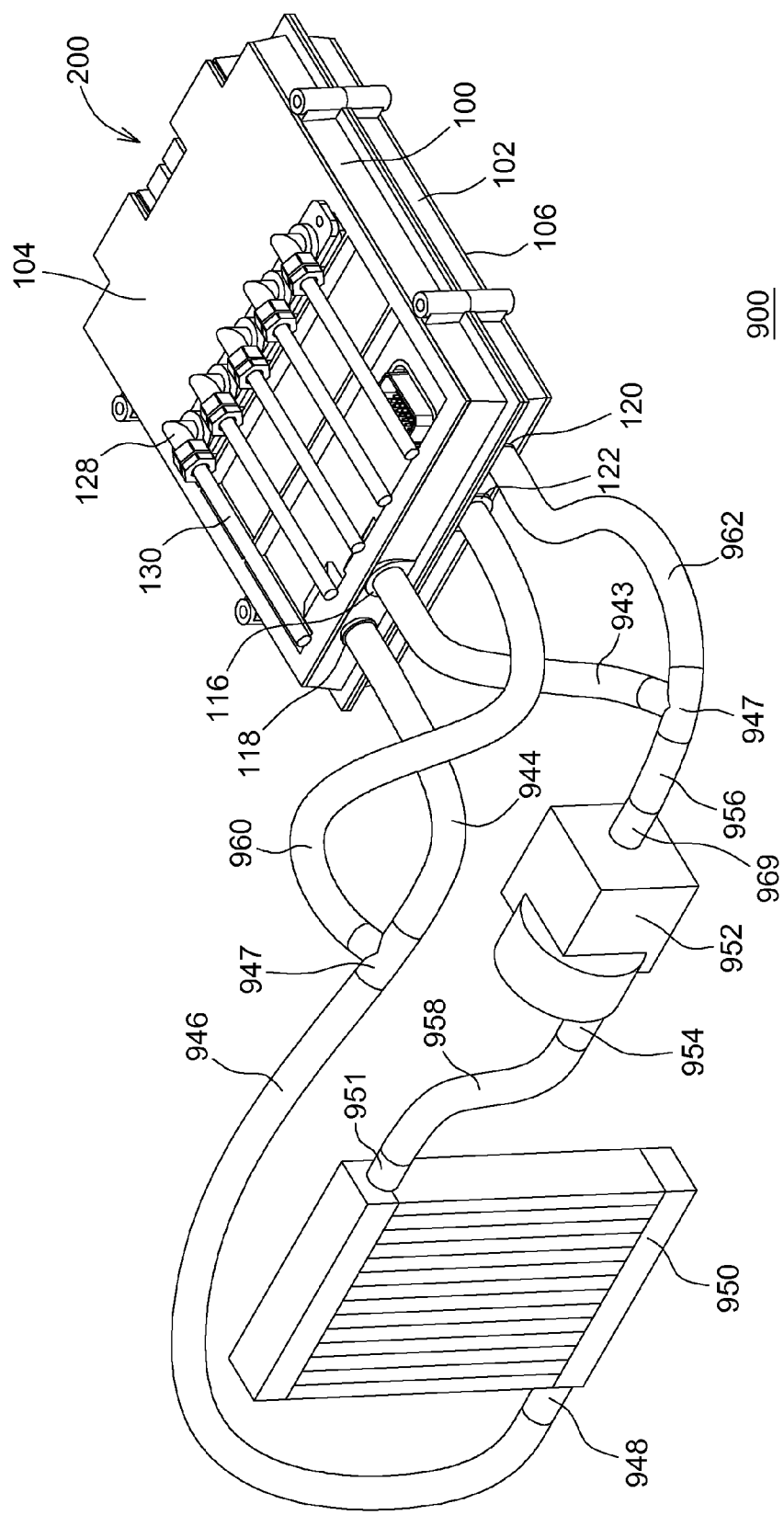
FIG. 10 is an illustrative example of a fluid cooling system that incorporates the electronic assembly of FIG. 1.

As shown, the first enclosure portion 100 has a first inlet 116 and a first outlet 118 for receiving and exhausting a coolant, respectively. Similarly, the second enclosure portion 102 has a second inlet 120 and a second outlet 122 for receiving and exhausting a coolant, respectively. FIG. 10 provides an illustrative example of one embodiment of how the coolant is circulated or conveyed through the electronic assembly 200 to provide enhanced cooling of the switching sections, capacitors 56 or other components within the electronic assembly 200.

Figure 3:
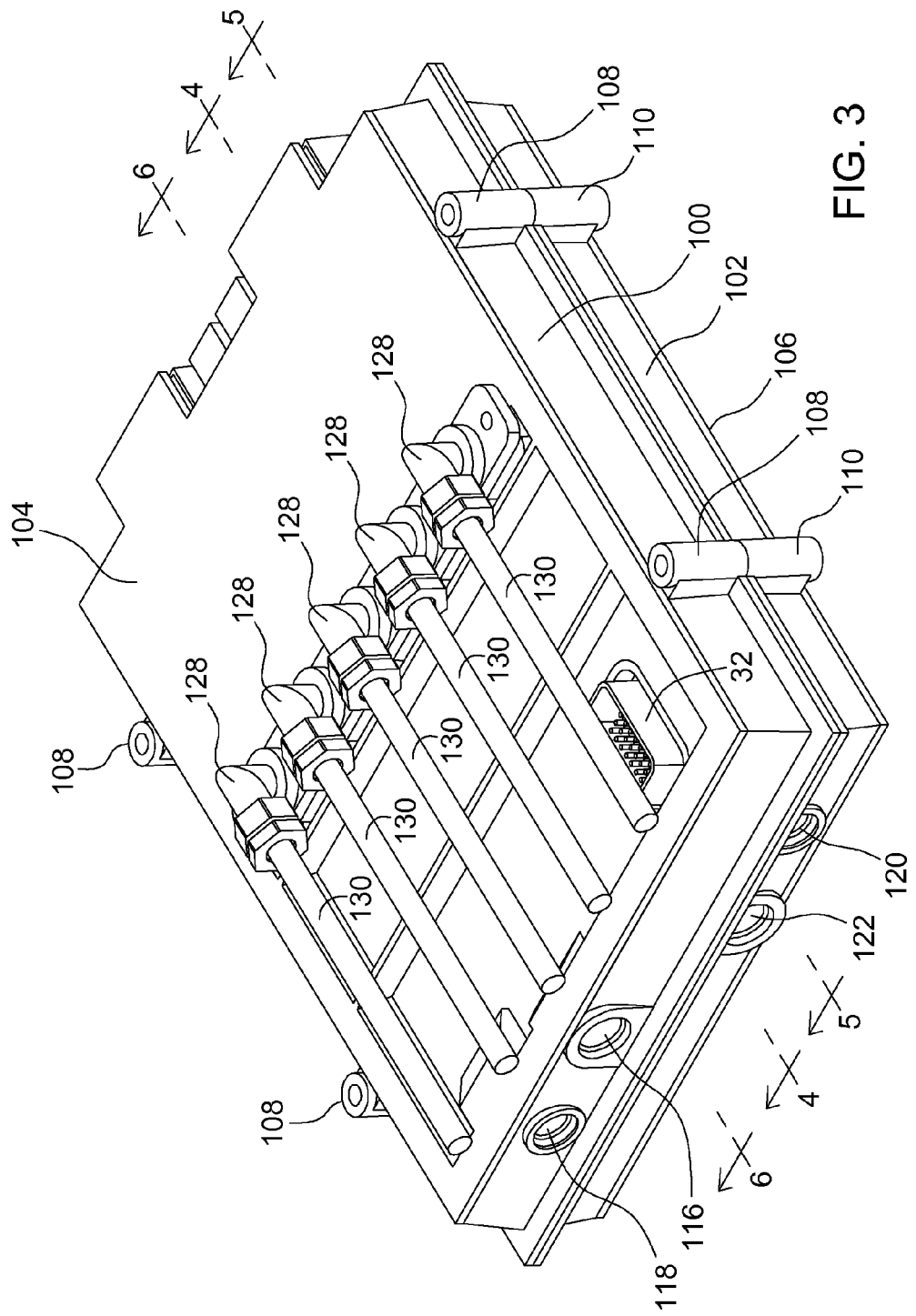
FIG. 3 is a perspective view of the electronic assembly of FIG. 2 that is assembled.

FIG. 3 shows the electronic assembly 200 of FIG. 2 in its assembled state. Each of the AC connectors (36, 38, 40) and DC connectors (42, 44) may be connected to conductors 130 or cables via mating connectors 128 (e.g., male plugs) that mate with the corresponding connectors (e.g., surface mount connectors or female connectors) of the electronic assembly 200. For example, the DC connectors (42, 44) may be connected or coupled to a direct current (DC) source, such as a battery, a generator, a fuel cell electrical output, or rectified alternator. Meanwhile, the AC connectors may be coupled or connected to corresponding phases of an electric motor (e.g., any conventional, unconventional or mutually coupled switched reluctance motor or permanent magnet alternating current motor) to be controlled, or an alternator or other electric machine.

Figure 4:
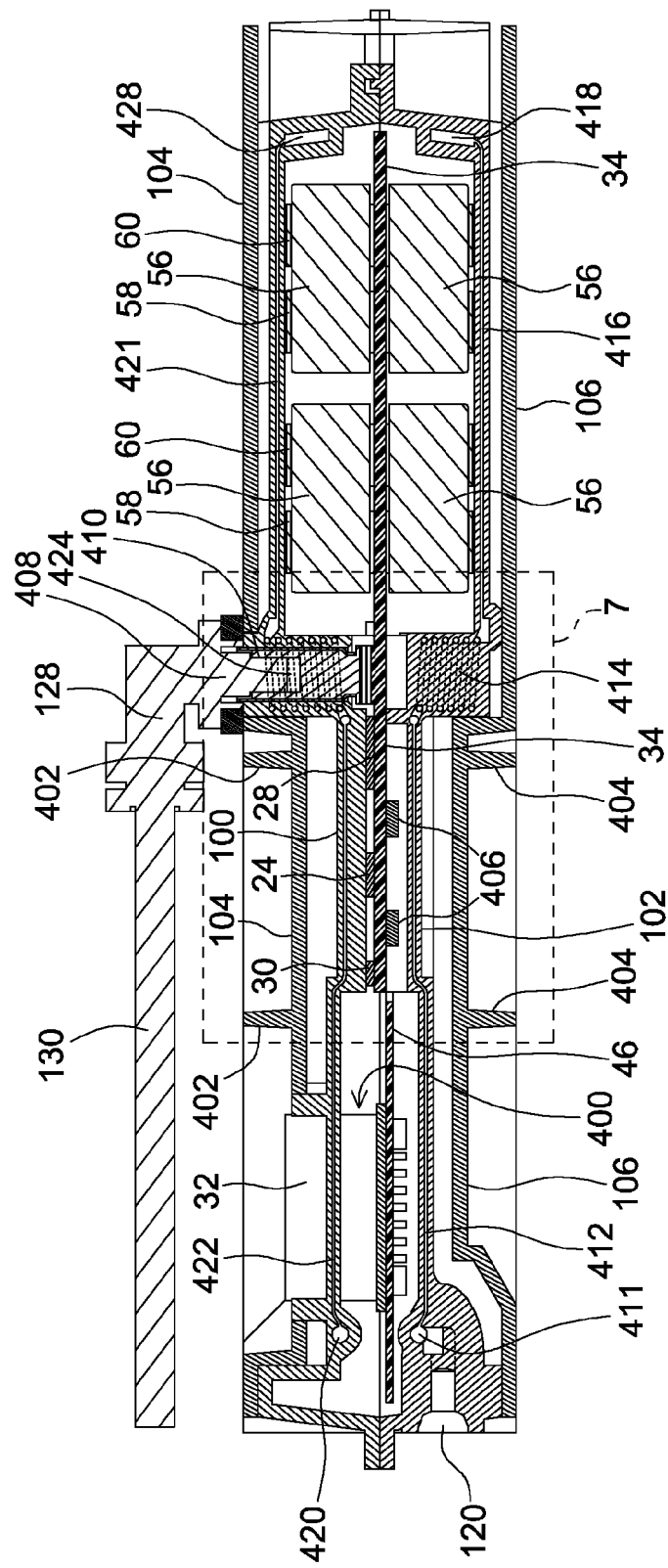
FIG. 4 is a first cross section of FIG. 3 along reference line 4-4 of FIG. 3, where reference line 4-4 is also shown in FIG. 1 and FIG. 2.

FIG. 4 illustrates a cross section of the electronic assembly 200 along reference line 4-4. Like reference numbers in FIG. 1 through FIG. 4, inclusive, indicate like elements or features. The cross section of FIG. 4 shows the coolant channels (420, 422, 424, 421, 428) that extend between the first inlet 116 and the first outlet 118 of the first housing assembly 132 or the first enclosure portion 100. The cross section of FIG. 4 also shows the coolant channels (411, 412, 414, 416, 418) that extend between the second inlet 120 and the second outlet 122 of the second housing assembly 134 or the second enclosure portion 102. In one embodiment, between the first inlet 116 and the first outlet 118, a first coolant channel (420, 422, 424, 421, 428) is fully contained within the first enclosure portion, which eliminates the need for cooperating ports in the electronic assembly 200 for the transfer of coolant between the first enclosure portion 100 and the second enclosure portion 102. Similarly, between the second inlet 120 and the second outlet 122, a second coolant channel is fully contained within the second enclosure portion 102, which eliminates the need for any cooperating ports in the electronic assembly 200 for the transfer of coolant between the first enclosure portion 100 and the second enclosure portion 102. Accordingly, any gaskets, seals, or adhesive between those cooperating ports, in the first enclosure portion 100 and the second enclosure portion 102, are eliminated and do not leak.

For illustrative purposes, FIG. 4 will be described such that the visible portion of the first coolant channel is designated as an outbound portion (420, 422, 424, 421, 428) of the first coolant channel, although the first coolant channel has an inbound portion that looks similar to the outbound portion. The outbound portion and the inbound portion of the first coolant channel are generally interchangeable because they are merely defined with respect to the direction of fluid or coolant flow, and with respect to the orientation of the pump discharge or pump input with respect the first inlet and first outlet. For example, the inbound portion and the outbound portion are redefined when the connections between the first inlet, the first output to the pump are reversed.

In one embodiment, an outbound portion (420, 422, 424, 421, 428) of the first coolant channel comprises a first inlet transverse chamber 420, a set of first inner outbound conduits 422, a set of first outbound transitions 424, a set of first outer outbound conduits 421, and a first outer transverse chamber 428, a set first inbound outer conduits, a set of first inbound transitions, a set of first inner inbound conduits. The outbound portion (420, 422, 424, 421, 428) of first coolant channel is coupled between the first inlet 116 and the first outlet 118 and may follow a circuitous path or serpentine path through the first enclosure portion 100 between the first inlet 116 and the first outlet 118. The outbound portion (420, 422, 424, 421, 428) of the first coolant channel can be described in conjunction with the direction of fluid flow from the first inlet 116 to the first outlet 118, where the outbound path travels from the first inlet 116 and where the inbound path travels toward the first outlet 118.

In the first coolant channel, the first inlet 116 communicates with the first inlet transverse chamber 420. A set of first inner outbound conduits 422 comprise one or more first inner outbound conduits emanating from (e.g., longitudinally in FIG. 4 in the plane of the sheet) the first inlet transverse chamber 420. The respective set of first outbound conduits 422 is coupled to a corresponding set of first outbound transitions 424. In one embodiment, each first outbound transition 424 region may comprise a substantially spiral, substantially elliptical, or substantially circular, or otherwise curved channel that links or connects a respective one of the first inner outbound conduits 422 to corresponding one of the first outer outbound conduits 424. In one configuration, one end of the set of first outer outbound conduits 421 is coupled to a corresponding set of the first outbound transitions 424, whereas the opposite end of the set of first outer outbound conduits 421 is coupled to the first outer transverse chamber 428.

In the second coolant channel (411, 412, 414, 416, 418), the second inlet 120 communicates with the second inlet transverse chamber 411. A set of second inner outbound conduits 412 comprise one or more second inner outbound conduits emanating from (e.g., longitudinally in FIG. 4 in the plane of the sheet) the second inlet transverse chamber 411. The respective set of inner outbound conduits 412 is coupled to a corresponding set of second outbound transitions 414. In one embodiment, each second outbound transition 414 may comprise a substantially spiral, substantially elliptical, or substantially circular, or otherwise curved channel that links or connects a respective one of the second inner outbound conduits 412 to corresponding one of the second outer outbound conduits 416. In one configuration, one end of the set of second outer outbound conduits 416 is coupled to a corresponding set of the second outbound transition 414, whereas the opposite end of the set of second outer outbound conduits 416 is coupled to the second outer transverse chamber 418, or a series of generally parallel curved conduits or loops.

In one embodiment, one or more of the transitions (424, 414) may comprise a substantially spiral, substantially elliptical, substantially circular or otherwise curved channel that circumnavigates or surrounds an exterior of a connector (e.g., surface-mount connector) associated with the substrate 34. Accordingly, each such transition (e.g., 424) has an inner diameter or generally cylindrical surface 410 that is configured to mate with, nest with, or interlock with a generally cylindrical outer surface 408 of the connector 40. As shown in FIG. 4, a transition 424 (e.g., first transition or upper transition) surrounds the exterior of the connector 40 in close proximity for heat transfer of thermal energy from the connector 40 to the coolant in the first coolant channel, whereas the transition 414 (e.g., second transition or lower transition) does not surround the connector (e.g., 40) in the configuration shown. The transition 414 may be composed of or associated with a metal or metallic structure in close proximity to a heat sink or fourth enclosure portion 106.

In one illustrative configuration, first enclosure portion 100 has an inner surface with a mating shape and size that corresponds to the contour or adjoining first surface mount connectors (36, 38, 40) or that corresponds to direct terminals (42, 44). The first enclosure portion 100 has a transition region (e.g., 414) of channels in a spiral path around an outer diameter of the first surface mount connector to provide thermal path for heat dissipation from the surface mount connector (36, 38, 40) or direct terminals (42, 44). For example, the inner surface is substantially cylindrical and engages a corresponding outer cylindrical surface of a corresponding one of the first surface mount connectors (36, 38, 40) or direct terminals (42, 44).

The first housing assembly 132 comprises a first enclosure portion 100 that overlies the substrate 34 and the primary metallic island 24; wherein the heat is conducted away from the primary metallic island 24 through a first enclosure portion 100 in contact with, above or in close proximity to the primary metallic island 24. For example, the heat is conducted from the primary metallic island 24 through the enclosure portion to the ambient air around the first enclosure portion 100. Cumulative with or separate from the heat transfer to the ambient air around the first enclosure portion 100, the heat is transferred to the fluid or coolant in the coolant channel. Heat or thermal energy is conducted away from the tertiary metallic island 28 through a first enclosure portion 100 in contact with, above or in close proximity to the tertiary metallic island 28. Heat or thermal energy is conducted away from a quaternary metallic island 30 through a first enclosure portion 100 in contact with, above or in close proximity to the quaternary metallic island 30. As illustrated, one or more conductive traces are on one or more sides of the substrate 34. The connector 32 may be surface-mounted to conductive pads on one side of the substrate, and may be mounted through a connector opening 15 (in FIG. 2) in the first enclosure portion 100.

In FIG. 4, the third enclosure portion 104 has one or more fins 402 or radiating elements for radiating thermal energy. In an alternative embodiment, the third enclosure portion 104 may be configured as a heat sink and forged, cast, stamped or otherwise formed from metal, an alloy or metallic material. Similarly, the fourth enclosure portion 106 has one or more fins 404 or radiating elements for radiating thermal energy. In an alternative embodiment, the fourth enclosure portion 106 may be configured as a heat sink and forged, cast, stamped or otherwise formed from metal, an alloy or metallic material.

Figure 5:
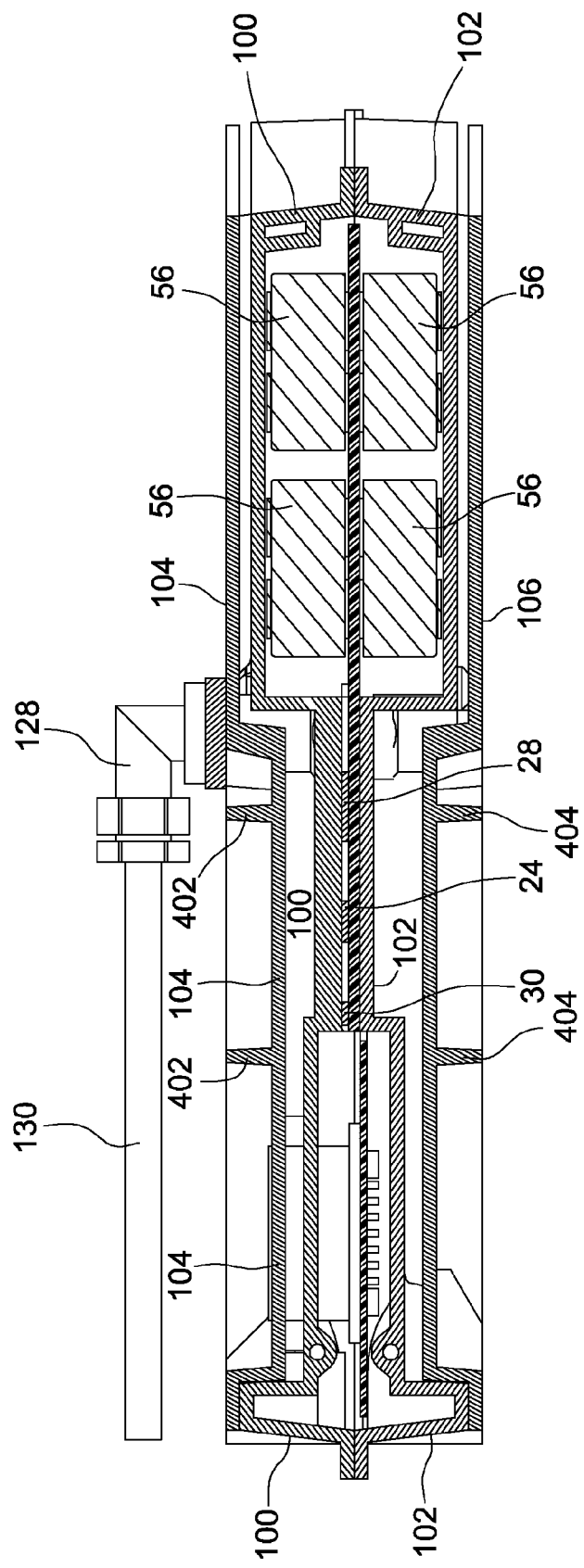
FIG. 5 is a second cross section of FIG. 3 along reference line 5-5 of FIG. 3, where reference line 5-5 is also shown in FIG. 1 and FIG. 2.

FIG. 5 shows a cross section of the electronic assembly 200 along reference line 5-5. Like reference numbers in FIG. 4 and FIG. 5 indicate like elements. The cross section of FIG. 5 does not show the cross section of any transitions or the cross section any AC connector (36, 38, 40) or DC terminal (42, 44). Further, the cross section of FIG. 5 falls between the first coolant channel and the second coolant channel within the first enclosure portion 100 and the second enclosure portion 102, respectively.

Figure 6:
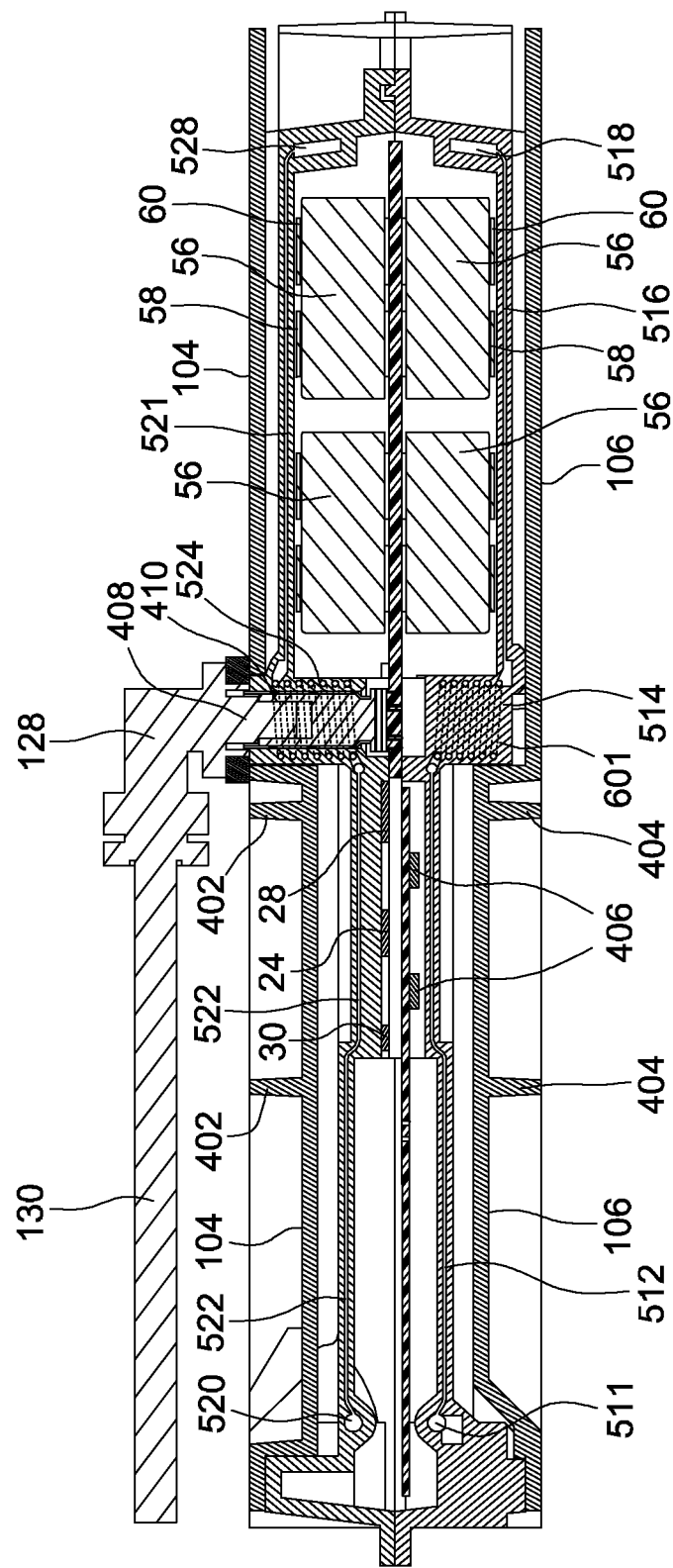
FIG. 6 is a third cross section of FIG. 3 along reference line 6-6 of FIG. 3, where reference line 6-6 is also shown in FIG. 1 and FIG. 2.

FIG. 6 shows a cross section of the electronic assembly 200 along reference line 6-6. Like reference numbers in FIG. 4 and FIG. 6 indicate like reference numbers. The cross section of FIG. 4 may disclose an outbound transition and corresponding outbound portions of the first and second conduits, whereas the cross section of FIG. 5 may show an inbound transition and the corresponding inbound portions of the first and second conduits.

A set of first outer inbound conduits 521 comprise one or more first outer inbound conduits 521 emanating from (e.g., longitudinally in FIG. 4 in the plane of the sheet) the first outer transverse chamber 528, or a series of generally parallel curved conduits or loops. The respective set of outer inbound conduits 521 is coupled to a corresponding set of first inbound transitions 524. In one embodiment, each first inbound transition 524 may comprise a substantially spiral, substantially elliptical, or substantially circular, or otherwise curved channel that links or connects a respective one of the first outer inbound conduits 521 to corresponding one of the first inner inbound conduits 522. In one configuration, one end of the set of first inner inbound conduits 522 is coupled to a corresponding set of the first inbound transitions 524, whereas the opposite end of the set of first inner inbound conduits 522 is coupled to the first inlet transverse chamber 520. The first inlet transverse chamber may be coupled to the first inlet 116 or the first outlet 118.

A set of second outer inbound conduits 516 comprise one or more second outer inbound conduits 516 emanating from (e.g., longitudinally in FIG. 4 in the plane of the sheet) the second outer transverse chamber 518 or a series of generally parallel curved conduits or loops. The respective set of second outer inbound conduits 516 is coupled to a corresponding set of second inbound transitions 514. In one embodiment, each second inbound transition 514 may comprise a substantially spiral, substantially elliptical, or substantially circular, or otherwise curved channel that links or connects a respective one of the second outer inbound conduits 516 to corresponding one of the second inner inbound conduits 512. In one configuration, one end of the set of second inner inbound conduits 512 is coupled to a corresponding set of the second inbound transitions 514, whereas the opposite end of the set of second inner inbound conduits 512 is coupled to the second outlet transverse chamber 511. The second outlet transverse chamber 511 may be coupled to the second inlet 120 or the second outlet 122.

In FIG. 4 through FIG. 6, the first enclosure portion 100 comprises a group of channels or micro-channels within the first enclosure portion 100 for conveying fluid or coolant, and where an inner surface of the first enclosure portion 100 is in contact with, above or in close proximity to one or more metallic islands (e.g., the primary metallic island 24, secondary metallic island 26, tertiary metallic island 28, or quaternary metallic island 30) for transfer of the heat from the metallic islands to the coolant or fluid within the channel or micro-channels. In one configuration, each AC connector (36, 38, 40) comprises surface mount connector is mounted on the substrate 34. Each AC connector is electrically connected to each corresponding phase output terminal of a switching section, such as the first semiconductor 20 and the second semiconductor 22. A tertiary metallic island 28 is located in a tertiary zone between adjacent connectors (26, 38, 40, 42, 44) or between adjacent surface mount connectors.

In one example, the second enclosure portion 102 comprises a group of channels or micro-channels within the second enclosure portion 102, and where an inner surface of the second enclosure portion 102 is in contact with, above or in close proximity an opposite side of the substrate 34 on which one or more metallic islands are found for transfer of the heat from one or more metallic islands. In one configuration, the first semiconductor 20 and the second semiconductor 22 comprise surface mount transistors that are mounted on the substrate 34 and electrically connected to corresponding ones of the metallic circuit traces (e.g., 406 in FIG. 4) and wherein the second enclosure portion 102 has an inner surface with a mating shape and size that corresponds to the contour or adjoining surface of the opposite side of the substrate 34 and any associated components (e.g., electrical or electronic components) on the substrate 34.

Figure 7:
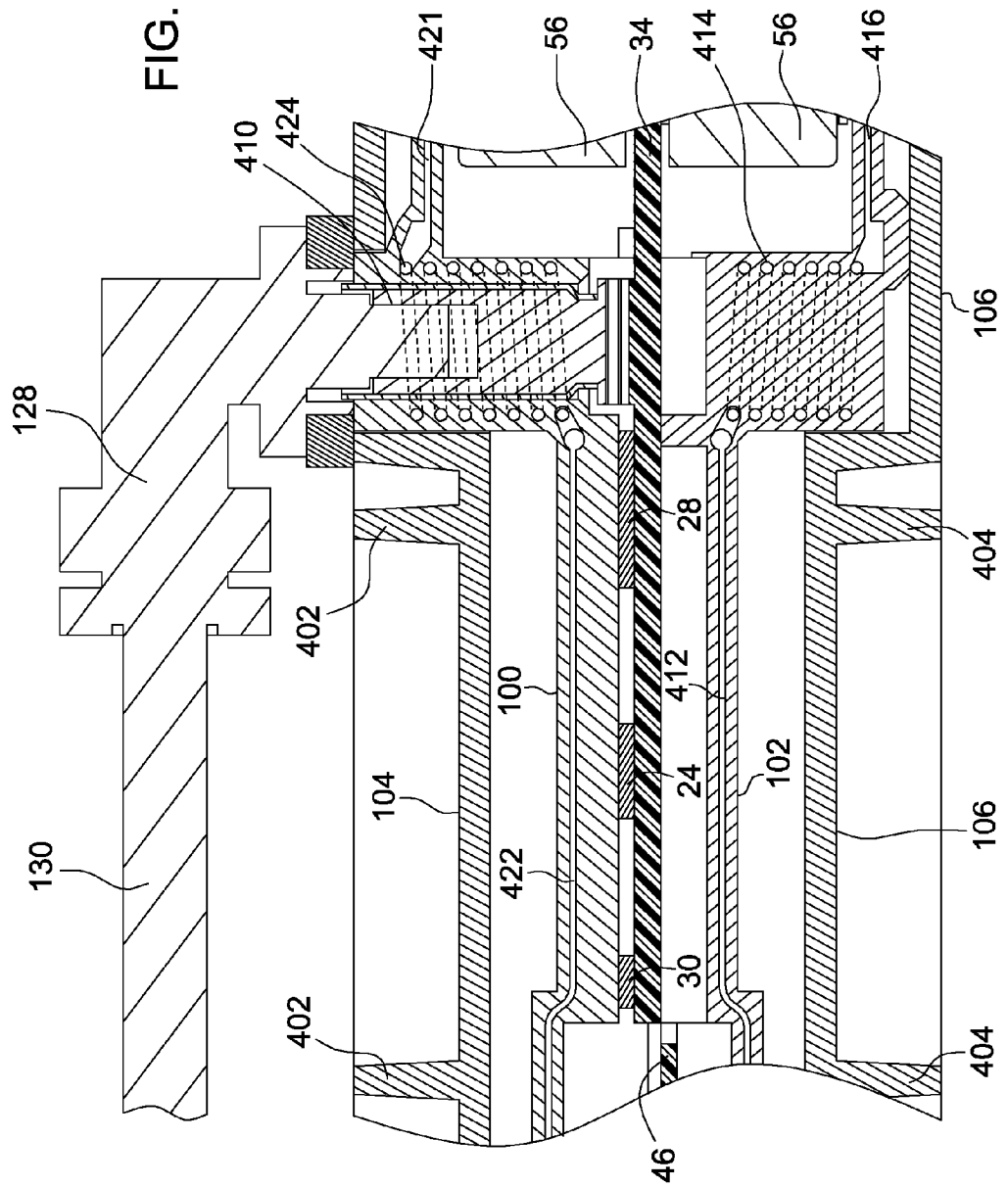
FIG. 7 is a cross section of one embodiment of an electronic assembly that illustrates an enlarged portion of rectangular region 7 of FIG. 4.

FIG. 7 illustrates an enlarged rectangular portion of the cross section of the electronic assembly 200 shown in FIG. 4. FIG. 7 clearly shows the transition that engages a connector (e.g., surface mount connector) that is connected to corresponding connector portion (e.g., plug) and conductor. Here, the corresponding connector portion is illustrated as right-angle connector although any connector (e.g., straight connector or ordinary connector) may fall within the scope of the disclosure.

In FIG. 7, the first enclosure portion 100 comprises a first conduit. In turn, the first conduit comprises a group of generally parallel and longitudinally extending channels or first micro-channels within the first enclosure portion 100, where an adjoining portion of the first enclosure portion 100 provides a thermal path between one or more metallic islands and the first conduit. As indicated previously, the metallic islands include one or more of the following islands: a primary metallic island 24, a secondary metallic island 26, a tertiary metallic island 28 and a quaternary metallic island. In one embodiment, the channels are synonymous with the inbound and outbound paths previously described herein.

As illustrated in FIG. 7, the second enclosure portion 102 comprises a second conduit. In turn, the second conduit comprises a group of generally parallel and longitudinally extending channels or second micro-channels within the second enclosure portion 102, where an adjoining portion of the second enclosure portion 102 provides a thermal path between one or more metallic islands and the second conduit. As indicated previously, the metallic islands include one or more of the following islands: a primary metallic island 24, a secondary metallic island 26, a tertiary metallic island 28 and a quaternary metallic island 30.

The third enclosure portion 104 is secured to the first connector portion. The third connector portion comprises a cover or heat sink (e.g., cover with external cooling fins or generally parallel ridges), to provide a supplemental path for transfer of the heat from one or more metallic islands of the electronic assembly 200. The fourth enclosure portion 106 is secured to the second connector portion. The fourth connector portion comprises a cover or heat sink (e.g., cover with external cooling fins or generally parallel ridges), to provide a supplemental path for transfer of the heat from one or more metallic islands of the electronic assembly 200.

The electronic assembly 200 of FIG. 8 is similar to the electronic assembly 200 of FIG. 7, except that the electronic assembly 200 of FIG. 8 further includes a thermal interface material (801, 802, 803), a thermally conductive adhesive or thermally conductive lubricant. For example, the thermal interface material (801, 802, 803) is used between the primary metallic island 24 and the first enclosure portion 100, between the tertiary metallic island 28 the first enclosure portion 100, and between the quaternary metallic island 30 and the first enclosure portion 100. Like reference numbers in FIG. 7 and FIG. 8 indicate like elements or features.

In one embodiment, the thermal interface material is a gap filer that can be used between the circuit board assembly 100 and an interior of the electronic assembly 200. For example, a thermal interface material may be injected, forced or put into a first gap between the circuit board assembly 100 and the generally conforming interior surface of the first enclosure portion 100 and between a second gap between the circuit board assembly 100 and the second enclosure portion 102. The thermal interface material can fill irregular depressions, recesses or voids in a layer. The thermal interface material is well suited for leaving behind zero or negligible bond lines after the thermal interface material is cured. Thermal interface material is used to avoid short circuits and metal-to-metal contact, where a live metal terminal (or an electrically conductive structure at a potential different than ground) may contact a metal component at electrical ground potential. The thermal interface material is well suited for carrying heat away from active components to coolant channels formed in the first enclosure portion 100, the second enclosure portion 102, or in the housing. For example, the thermal interface material can be in direct connect with the metallic islands (e.g., 30, 24, 28) or heat sinking strips on the substrate. Further, the thermal interface material may overlie the capacitors 56 and may fill a void between the capacitors 56 and the interior of the first enclosure portion 100 and the second enclosure portion 102 to draw or conduct heat away from the capacitors 52.

In one configuration, the thermal management material is applied (e.g., sprayed on) and when it cures it is a dielectric structure with relatively high thermal conductivity, such as about 240 Watt/meter-Kelvin in the x-y direction and about 5 Watt/meter-Kelvin in the Z direction. Where the x-y plane is the plane of the surface of the substrate 34 such that heat transfer theoretically takes place with an anisotropic gradient within the electronic assembly 200.

As illustrated in FIG. 1, where flip chip or flip die methods are used for the first semiconductor switch 20 and the second semiconductor switch 22, a first thermal interface material layer could overlie (or be bonded to) one side of the substrate 34 and second thermal interface material layer could overlie (or be bonded to) the first thermal interface material layer, where the multiple thermal interface layers tend to provide shock absorption and vibration stress reduction.

In one configuration, if the thermally conductive material comprises a resin that cures as dielectric material, the thermally conductive material offers better abrasion resistance and greater adhesion to surrounding components and interior of the housing than conductive grease, for example.

In an alternate embodiment, the substrate 34, as an unpopulated (bare board) circuit board (e.g., ceramic substrate), has a coefficient of thermal expansion (CTE) interface layer to match a first CTE of the metallic islands (e.g., heavy copper pours pattern) to a second CTE of the substrate 34 for thermal management. For example, the CTE interface layer comprises a dielectric layer (e.g., substantially planer layer) of polymer, plastic or fiber filled polymer that resides between the metallic islands (e.g., 30, 24 and 28) and the substrate 34. In one illustrative example, the CTE interface layer comprises a polyimide or bismaleimide triazine (BT) material bonded to a substrate 34, such as a ceramic substrate (e.g., FR4). Further, the CTE interface layer, which comprises a polyimide or bismaleimide triazine (BT) material bonded to a substrate 34, may be used to provide a CTE compliance between a substrate 34 and an ancillary substrate 46 or between substrate 34 and a gate driver circuit board underlying the connector 32.

In one embodiment, the electronic assembly 200 of FIG. 9 is similar to the electronic assembly 200 of FIG. 7, except that the electronic assembly 200 of FIG. 9 further includes a thermally conductive via 900 (e.g., a plastic via, polymer via, a dielectric thermally conductive via, a thermoplastic via or thermoplastic insert) in thermal communication with a heat sink metallic island 901 or ground plane on an opposite side of the substrate 34 from the metallic islands (24, 28, 30). One or more thermally conductive vias 900 (e.g., thermoplastic vias or thermoplastic inserts) can be composed of a dielectric material that is thermally conducting, but electrically insulated: (1) to ensure that metallic islands (28, 24, 30) do not form or facilitate an electrical connection (e.g., an electrical short circuit, if the metallic island is configured to be electrically floating or at operational voltage potential other than ground potential) or (2) to isolate different phase outputs of an inverter or electronic assembly 200 where a common ground plane is used between one or more metallic islands (24, 38, 30) and a corresponding heat sink metallic island 901 or ground plane.

In an alternate embodiment, the electronic assembly 200 of FIG. 9 is similar to the electronic assembly 200 of FIG. 7, except that the electronic assembly 200 of FIG. 9 further includes a thermally conductive via 900, a blind conductive via, or plated through-hole in thermal communication with a heat sink metallic island 901 or ground plane on an opposite side of the substrate 34 from the metallic islands (24, 28, 30), where the thermally conductive via 900 comprises an electrically conductive and thermally conductive metallic via. For example, in certain embodiments of this disclosure, thermally conductive vias 900 can connect (e.g., electrically and mechanically) one or more of the metallic islands (28, 24, 30) on a first side of the substrate 34 with one or more heat-sink metallic islands 901 or one or more ground planes on a second side of the substrate 34, where the second side is opposite the first side. FIG. 9 shows generally that thermally conductive vias 900 (e.g., dielectric thermally conductive vias, thermally conductive metallic vias, or both) 900 are connected (e.g., thermally, mechanically, or electrically, or any combination of the foregoing connection types) between the primary metallic island 24 and the metallic ground plane 901, between the tertiary metallic island 28 and the heat-sink metallic island 901 (also referred to as a metallic ground plane or a phase-specific ground plane), and between the quaternary metallic island 30 and the metallic ground plane 901. Like reference numbers in FIG. 7 and FIG. 8 indicate like elements or features.

FIG. 10 is a perspective view of an illustrative example of a fluid cooling system 900 that incorporates the electronic assembly 200 of FIG. 1. The fluid cooling system 900 comprises a radiator 950 that is coupled to a pump 952 with tubing 958. In turn, the pump 952 is coupled to an electronic assembly 200 via tubing (956, 962, 943). The radiator 950 has connection ports (948, 951). At least one connection port (e.g., 951) is connected to a pump inlet 954 or pump outlet 956 via tubing 958, where the opposite connection 964 from the pump 952 is connected to the electronic assembly 200 via tubing. For example, a first radiator connection port 951 is coupled to a pump inlet 954, whereas a second radiator connection port 948 is coupled to a pump outlet 964 through tubing (944, 946), one or more fittings 947, internal channels within the electronic assembly 200, and tubing (943, 962, 956).

The electronic assembly 200 has a first enclosure portion 100 and a second enclosure portion 102 that are secured together to form a housing. The housing also features a third enclosure portion 104 and the fourth enclosure portion 106. The first enclosure portion 100 has a first inlet 116 and first outlet 118. The second enclosure portion 102 has a second inlet 120 and the second outlet 122.

As illustrated, the pump outlet 964 is coupled to the first inlet 116 and the second inlet 120 of the electronic assembly 200 via tubes (956, 962, 943) and tee fittings, Y-fittings or other appropriate connectors 947. Similarly, the second radiator port is coupled to the first outlet 118 and the second outlet 122 via tubes and tee fittings, Y-fittings, or other appropriate connectors 947.

During or prior to operation, the radiator 950 is filled with a fluid or coolant. The radiator 950 can provide a reservoir of coolant; the channels and associated chambers within the electronic assembly 200 can provide a reservoir of coolant, or both the radiator 950 the electronic assembly 200 can provide a reservoir of coolant. The pump 952 conveys fluid or coolant into the first inlet 116 for circulation of the fluid or coolant within the first enclosure portion 100. The fluid or coolant exits the first enclosure portion 100 at the first outlet 118 that is coupled to the radiator 950 with tubing. Similarly, the pump 952 conveys fluid or coolant into a second inlet 120 for circulation of the fluid or coolant within the second enclosure portion 102. The fluid or coolant exits the second enclosure portion 102 at the second outlet 122 that is coupled to the radiator 952 with tubing.

The circuit board assembly 11 may be manufactured in accordance with various techniques, where some examples follow here. The circuit board assembly 11 (e.g., power switching printed circuit board) is populated with or by mounting surface mount film capacitor elements, connector sockets and planar power switching devices on one side or both sides the substrate 34 and ancillary substrate 46. For example, the components may be mounted using a pick-and-place mechanization. The electronic assembly provides control and gate driver functionality circuits including low voltage connector for battery and electric machine harness.

The housing (100, 102, 104, 106) may comprise a case or cover that is molded (e.g., injection molded), constructed by three-dimensional printing or otherwise formed. For example, in one embodiment the electronics assembly 200 can be made in a highly automated process using three-dimensional printing for the first enclosure portion 100 and the second enclosure portion 102 to support the formation on integral coolant channels in the housing. The housing comprises a first enclosure 100 and a second enclosure portion 102. Each enclosure portion (100, 102) has an interior surface shape/profile and features that conform to the shape and profile of parts and interconnects placed on the circuit board assembly 11 and a control gate and driver circuit board underlying connector 32. Accordingly, the electronic assembly 200 is well suited for high density packaging and using less volume for the capacity (e.g., current or power) output of the electronic assembly 200. In one configuration, the substrate 34 may be connected to the ancillary substrate 46 (or gate driver circuit board) by using a ball grid array (BGA) interconnect. For instance, an assembled substrate 34 with components mounted thereon could go through reflow process with control and gate drive circuit board.

The connecters (36, 38, 40, 42, 44) comprise surface mount connectors that support plug (pin) and socket type of electrical connections between the load (e.g., electric motor, generator or machine) and the energy source (e.g., DC energy source) for the electronic assembly 200. The connectors are populated between capacitor elements and planar chipsets of the first semiconductor switch 20 and the second semiconductor switch 22. The above placement of the connectors (36, 38, 40, 42, 44) in the electronic assembly 200 supports electrical design functionality (e.g., minimization of system inductance and avoidance of unnecessary current loops), thermal design functionality (e.g., space between chipsets (20,22) and capacitors (56) used to separate parts that operate at substantial temperature difference and also socket increase overall surface area for improved heat sinking), and mechanical functionality (e.g., minimization of overall area needed for circuit board 11).

In one embodiment, the ancillary substrate 46 or a circuit board underlying connector 32 comprises a gate driver circuit and control board. The ancillary substrate 46 may be associated with a gate driver circuit for controlling one or more phases of the first semiconductor switches 20 and the second semiconductor switches. The gate driver circuit may be miniaturized using method of Application Specific Integrated Circuit (ASIC). ASIC used to miniaturize gate driver circuit not only simplifies the layout of the conductive by circuit confinement but also increases immunity from electromagnetic interference and stray effects caused by change in current over time and change in voltage over time. The gate driver circuit features a current sensing circuit and low voltage control with discrete circuits. In one configuration, the current sensing circuit is placed close to or adjacent to inverter alternating current output or one or more metallic islands, where the current sensing circuit is accompanied by any necessary shielding and flux/field concentrators. The low voltage control and discrete circuits can be embedded within a Field Programmable Gate Array (FPGA) and discrete electronics parts and integrated circuits. The gate driver circuit and control board is populated with surface mount low voltage connector harness connection with battery and sensors placed on electric motor/generator driven by inverter.

In one embodiment, the housing can be formed by a three-dimensional (3-D) printed process or injection molded process. The housing has surface shape/profile and features conforming to the circuit board assembly 11 used in inverter assembly. The housing facilitates enhanced thermal management of the semiconductor switches (20, 22), film capacitor 56 (e.g., film capacitors), connectors (e.g., 36, 38, 40, 42, 44) interconnects on the circuit board 11, and all heat generating circuits placed on the circuit board 11.

To form the housing with 3-D printing process, first a laser scanner is used to scan the circuit board 11. The laser scanner produces one or more three-dimensional images of the profile of the circuit board. Separate laser images of each side of the circuit board 11 are collected as input data. Second, a preform thermal interface material (TIM) screen that can be deposited on the component-populated circuit board 11. TIM allows a close contact between heat generating components or regions, heat conducting components or regions, or heat radiating components or regions within assembly 200 and an interior of the housing. In an alternate configuration, a layer of TIM with an optimized thickness (e.g., optimized for electrical insulation and thermal conduction) can be deployed on the interior face of first enclosure portion 100 and the second enclosure portion 102.

Third, the housing can be composed of a polymer, plastic or metallic material. In one configuration, the housing is 3-D printed from a light weight metal such as aluminum or a polymer metallic composite based on one or more scanned profiles or scanned images collected by the laser scanner. The 3-D printed housing conforms to parts and features of circuit board 11. For example, the 3-D printed housing of inverter can touch or contact all components and parts on the circuit board 11. As illustrated in FIG. 4 and FIG. 7, the 3-D printed housing will have built-in coolant channels or micro-channels for coolant that creates turbulent flow of coolant. The coolant channels making double-sided cooling of the semiconductor switches (20, 22) effective along with the lateral withdrawal of heat from power devices by thermal management of interconnects. This automated 3-D printing process for the inverter housing will effectively reduce unused volume or empty space within electronic assembly 200 that supports reduced package size of the electronic assembly 200. The 3-D printing will allow thickness optimization of the inverter housing/enclosure, therefore, 3-D printing process if exploited properly can significantly reduce the material needed, and thus a significant costs saving can be realized as the 3-D printing process matures. The 3-D printed housing facilitates improved access of the semiconductor switches (20, 22) to thermal conductive liquid that results in a higher power rating for the inverter.

In an alternate embodiment, injection molding could be used to form the housing or enclosure portions (100, 102). The housing promotes resistance to vibrations and shocks because the enclosure portions (100, 102) are tightly packed with TIM and the circuit board 11, encapsulated with TIM. Unused and exposed areas of circuit board 11 will have conductive land patterns or metallic islands to effectively increases overall contact area between circuit board 11 and the pre-formed thermal interface material (TIM). TIM provides electrical insulation and thermal conduction between the circuit board assembly 11 parts and the housing, such as the first enclosure portion 100 and the second enclosure portion 102.

A TIM layer can be placed, wrapped, injected, sprayed or deposited over one or more of the following parts or components within the inverter assembly: the enclosures (100 102), the substrate 34, the ancillary substrate 46, printed circuit board 11, capacitors 56, metallic islands (30, 24, 28), strips, pads, islands or fin shaped metallic features or patterns on the surface of the circuit board 11, connectors or power sockets (36, 38, 40, 42, 44), any heat generating circuits on control and gate driver circuit board, any parts that need containment for vulnerability to vibration and shocks, and/or any parts that would otherwise be susceptible to thermal shocks or temperature swings. The thermal interface material (TIM) between inverter circuit board 11 and enclosure portions (100, 102) helps to realize high-capacity (e.g., current output), high packaging density (e.g., current output per spatial volume occupied by the assembly 200).

TIM facilitates enhanced heat dissipation from the electronic assembly 200, such as a possible, double-sided cooling approach for the semiconductor switches (20, 22). For example, TIM might enable a significant increase in the number of power and thermal cycles for the semiconductor switches (20, 22). This heat dissipation approach potentially results in an improvement in semiconductor device reliability as compared to power semiconductor devices used in conventional electronic assemblies. Thermal interface material (TIM) that is bonded to the interior and components of the assembly 200 tends to minimize thermal resistance from junction to coolant channels in the heat exchanger (inverter cold plate). An increased margin between allowed maximum junction temperature (e.g., Tj_max, such as approximately 175 degrees Celsius and beyond) for power devices and maximum coolant temperature (e.g., as high as 105 degrees Celsius) provide an opportunity for decreased die size of the semiconductor devices.

Having described the preferred embodiment, it will become apparent that various modifications can be made without departing from the scope of the invention as defined in the accompanying claims.

The following is claimed:

1. An electronic assembly for an inverter, the electronic assembly comprising:
   a substrate having a dielectric layer and metallic circuit traces;
   a plurality of terminals for connection to a direct current source;
   a first semiconductor and a second semiconductor mounted on the substrate and coupled together between the terminals of the direct current source; and
   a primary metallic island located in a primary zone between the first semiconductor and the second semiconductor, the primary metallic island being separate from the first semiconductor and the second semiconductor, and the primary metallic island having a greater height or thickness than the metallic circuit traces, the primary metallic island providing a heat sink to radiate heat; a first enclosure portion overlying the substrate and the primary metallic island; wherein the heat is conducted away from the primary metallic island through a first enclosure portion in contact with, above or in close proximity to the primary metallic island, and wherein the first enclosure portion comprises a group of coolant channels or micro-channels within an adjoining cover or enclosure in contact with, above or in close proximity to the primary metallic island for transfer of the heat from the primary metallic island.

2. The electronic assembly according to claim 1 wherein the heat is conducted away from the primary metallic island through thermally conductive dielectric vias connected between the primary metallic island and a ground plane or a heat sink on an opposite side of the substrate.

3. The electronic assembly according to claim 1 wherein a thermal interface material, a thermally conductive adhesive or a thermally conductive lubricant is used between the primary metallic island and the first enclosure portion.

4. The electronic assembly according to claim 1 wherein the first semiconductor and the second semiconductor comprise surface mount transistors that are mounted on the substrate and electrically connected to corresponding ones of the metallic circuit traces and wherein the first enclosure portion has an inner surface with a mating shape and size that corresponds to the contour or adjoining surface of the primary metallic island and the surface mount transistors.

5. The electronic assembly according to claim 1 further comprising:
a plurality of first surface mount connectors mounted on the substrate that are electrically connected to the respective terminals; and
a secondary metallic island located in a secondary zone between adjacent first surface mount connectors, the secondary metallic island being separate from the first surface mount connectors.

6. The electronic assembly according to claim 5 wherein the first enclosure portion comprises a group of channels or micro-channels within the first enclosure portion, and where an inner surface of the first enclosure portion is in contact with, above or in close proximity to the secondary metallic island for transfer of the heat from the secondary metallic island.

7. The electronic assembly according to claim 1 further comprising:
a plurality of second surface mount connectors mounted on the substrate that are electrically connected to a first phase output terminal of the first semiconductor and the second semiconductor; and
a tertiary metallic island located in a tertiary zone between adjacent second surface mount connectors, the tertiary island being separate from the second surface mount connectors.

8. The electronic assembly according to claim 7 wherein the first enclosure portion comprises a group of micro-channels within the first enclosure portion, and where an inner surface of the first enclosure portion is in contact with, above or in close proximity to the tertiary metallic island for transfer of the heat from the tertiary metallic island.

9. An electronic assembly for an inverter, the electronic assembly comprising:
a substrate having a dielectric layer and metallic circuit traces;
a first enclosure portion for mounting above the substrate, the first enclosure portion having a plurality of coolant channels located therein;
a second enclosure portion for mounting below the substrate;
a plurality of terminals for connection to a direct current source;
a first semiconductor and a second semiconductor mounted on the substrate and coupled together between the terminals of the direct current source; and
a primary metallic island located in a primary zone between the first semiconductor and the second semiconductor, the primary metallic island being separate from the first semiconductor and the second semiconductor, and the primary metallic island having a greater height or thickness than the metallic circuit traces, the primary metallic island providing a heat sink to radiate heat for transfer via the coolant channels within an adjoining first enclosure portion in contact with, above or in close proximity to the primary metallic island.

10. The electronic assembly according to claim 9 wherein the coolant channels of the first enclosure portion further comprises:
a series of inlet coolant channels for conveying/circulating the coolant within the first enclosure portion, the inlet channels adapted to receive coolant from an inlet port.

11. The electronic assembly according to claim 9 wherein the coolant channels of the first enclosure portion further comprises:
a series of outlet coolant channels for conveying/circulating the coolant within the first enclosure portion, the outlet channels adapted to receive coolant from an outlet port.

12. The electronic assembly according to claim 9 wherein the coolant channels of first enclosure portion comprise:
an inlet port in the first enclosure portion for receiving a coolant;
a series of inlet coolant channels for conveying/circulating the coolant within the first enclosure portion, the channels in communication with a distributor portion associated with the inlet port;
a series of outlet coolant channels for conveying/circulating the coolant within the first enclosure portion, the channels in communication with an transition portion between the curved arrangement and the outlet coolant channels; and
an outlet port in the first enclosure portion for exhausting the coolant.

13. The electronic assembly according to claim 12 further comprising:
a radiator for receiving the exhausted coolant;
a pump associated with the radiator to circulate the coolant within the radiator and the first enclosure portion.

14. The electronic assembly according to claim 9 further comprising:
a plurality of first surface mount connectors mounted on the substrate that are electrically connected to the terminals or to ones of the conductive traces; and
a secondary metallic island located in a secondary zone between adjacent surface mount connectors.

15. The electronic assembly according to claim 14 further comprising:
a series of inlet coolant channels or a series of outlet coolant channels in the first enclosure portion and underlying the secondary metallic island.

16. The electronic assembly according to claim 9 further comprising:
a plurality of second surface mount connectors mounted on the substrate that are electrically connected to a first phase output terminal of the first semiconductor and the second semiconductor; and
a tertiary metallic island located in a tertiary zone between adjacent second surface mount connectors, the tertiary metallic island being separate from the second surface mount connectors.

17. The electronic assembly according to claim 16 further comprising:
a series of inlet coolant channels or a series of outlet coolant channels in the first enclosure portion and underlying the tertiary metallic island.

18. The electronic assembly according to claim 9 wherein an inner surface of the first enclosure portion conforms in size and shape to mate with the substrate as populated with one or more surface-mount components.

19. The electronic assembly according to claim 18 wherein the surface mount components comprise one or more of the following components: transistors, capacitors and connectors.

20. The electronic assembly according to claim 9 wherein the first semiconductor and the second semiconductor comprise surface mount transistors that are mounted on the substrate and electrically connected to corresponding ones of the metallic circuit traces.

21. The electronic assembly according to claim 9 wherein the second enclosure portion has one or more cooling fins for heat dissipation.

22. The electronic assembly according to claim 9 wherein the first enclosure portion and the second enclosure portion mate to form a housing for the substrate.

* * * * *